US 6,814,296 B2

(12) United States Patent
Angle et al.

(10) Patent No.: US 6,814,296 B2
(45) Date of Patent: Nov. 9, 2004

(54) INTEGRATED CIRCUIT AND ASSOCIATED DESIGN METHOD WITH ANTENNA ERROR CONTROL USING SPARE GATES

(75) Inventors: Jay H. Angle, Whitehall, PA (US); Christopher D. Gorsuch, Walnutport, PA (US); Oscar G. Mercado, Bethlehem, PA (US); Anthony K. Myers, Hamburg, PA (US); John A. Schadt, Bethlehem, PA (US); Brian W. Yeager, Schuykill Haven, PA (US)

(73) Assignee: Lattice Semiconductor Corp., Hillsboro, OR (US)

( * ) Notice: Subject to any disclaimer, the term of this patent is extended or adjusted under 35 U.S.C. 154(b) by 364 days.

(21) Appl. No.: 10/135,308

(22) Filed: Apr. 30, 2002

(65) Prior Publication Data

US 2002/0167042 A1 Nov. 14, 2002

Related U.S. Application Data

(60) Provisional application No. 60/287,900, filed on May 1, 2001.

(51) Int. Cl.$^7$ .............................................. G06K 19/06
(52) U.S. Cl. .......................................... 235/492; 705/7
(58) Field of Search .............................. 235/375, 492; 716/7; 257/709

(56) References Cited

U.S. PATENT DOCUMENTS

| 4,228,528 A | 10/1980 | Cenker et al. |
| 4,319,396 A | 3/1982 | Law et al. |
| 4,870,302 A | 9/1989 | Freeman |
| 5,313,119 A | 5/1994 | Cooke et al. |
| 5,384,497 A | 1/1995 | Britton et al. |
| 5,416,489 A * | 5/1995 | Mailloux .................... 342/173 |
| 5,416,740 A | 5/1995 | Fujita et al. |
| 5,459,342 A | 10/1995 | Nogami et al. |
| 5,679,967 A | 10/1997 | Janai et al. |
| 5,696,943 A | 12/1997 | Lee |
| 5,777,887 A | 7/1998 | Marple et al. |
| 5,892,249 A | 4/1999 | Courtright et al. |
| 5,959,905 A | 9/1999 | Payne |
| 6,020,755 A | 2/2000 | Andrews et al. |
| 6,222,211 B1 | 4/2001 | Chen |
| 6,404,226 B1 | 6/2002 | Schadt |
| 6,421,816 B1 * | 7/2002 | Ishikura ......................... 716/7 |

* cited by examiner

Primary Examiner—Mark Tremblay

(57) ABSTRACT

Antenna errors are corrected in an integrated circuit design utilizing spare gates distributed throughout the integrated circuit. An integrated circuit in accordance with the invention includes standard cells interspersed with spare gates. For example, the circuit may include one or more rows of spare gates arranged between groups of rows of standard cells, or islands of spare gates arranged between groups of rows of standard cells. A signal line of the integrated circuit having a detected antenna error associated therewith is coupled via one or more conductors associated with at least one metal layer of the integrated circuit to a diode or other antenna error control circuitry formed using at least one of the spare gates. The standard cells and spare gates are preferably placed in accordance with a placement operation of an automated place and route process of a standard cell computer-aided design (CAD) tool. The coupling of the signal line having the detected antenna error associated therewith to the antenna error control circuitry formed using at least one of the spare gates is preferably determined as part of a routing operation of the automated place and route process of the standard cell CAD tool. The spare gates are preferably implemented as spare gate cells using a base transistor structure compatible with the standard cell CAD tool.

16 Claims, 7 Drawing Sheets

INTEGRATED CIRCUIT AND ASSOCIATED DESIGN METHOD WITH ANTENNA ERROR CONTROL USING SPARE GATES

PRIORITY CLAIM

The present application claims the priority of U.S. Provisional Application Ser. No. 60/287,900 filed May 1, 2001 and entitled "Integrated Circuit Base Transistor Structure and Associated Programmable Cell Library."

RELATED APPLICATION(S)

The present invention is related to the invention described in co-pending U.S. patent application Ser. No. 10/082,050, filed Feb. 14, 2002 in the name of inventors Stephen R. Cebenko et al. and entitled "Integrated Circuit Base Transistor Structure and Associated Programmable Cell Library," which is commonly assigned herewith and is incorporated by reference herein.

TECHNICAL FIELD

The present invention relates generally to integrated circuits and integrated circuit design processes, and more particularly to techniques for controlling antenna errors that can arise in an integrated circuit design.

BACKGROUND

Standard cell application-specific integrated circuits (ASICs) provide a number of significant advantages over other types of integrated circuits, including more manageable die size, lower piece-part cost, higher performance, and more reliable design flow. The standard cell approach is generally considered preferable to other competing approaches such as custom design and programmable logic. As a result, most existing integrated circuit computer-aided design (CAD) tools, such as place and route tools, are configured for operation with the standard cell approach. Examples of standard cell CAD tools known in the art include the Apollo toolset commercially available from Avanti, and the Silicon Ensemble and First Encounter toolsets commercially available from Cadence Design Systems. In general, CAD tools designed for programmable logic are often incompatible with standard cell tools and may require specially trained experts.

One potential problem associated with the standard cell approach is that non-recurring expense (NRE) and process cycle time for development of a given design may still be unduly high. The principal components of the NRE are the cost of a new lot start and the cost of a new mask set as required to implement changes in a standard cell design. As the transistor technology shrinks in size, the lot start and mask set costs can increase considerably. With regard to process cycle time, ASICs typically undergo several design iterations before qualifying for full production. Reaching production with pure standard cell technology can thus be costly and time consuming at a time when market forces are squeezing costs and shortening development cycles.

A number of techniques have been developed in an attempt to alleviate the above-noted problem of the standard cell approach.

One such technique involves the use of so-called multi-chip shuttles to amortize the lot start and mask set costs over several chips. Basically, a prototype lot is ordered for model production only where there may be four to six individual chips placed on the same wafer and reticle. The drawbacks of this technique include a limited die size for each constituent chip, difficulty in timing and coordination of mask order and other functions across four to six chip projects, and potential saw-apart and packaging problems.

Another known technique involves the embedding of spare standard cell gates in a chip netlist to be used at a later time for design changes. However, these spare gates are generally hand-instantiated into the netlist by the customer, the level of design change supported is extremely limited, and wiring the change into the design can be difficult due to poor cell placement.

A third technique involves embedding programmable logic within a standard cell ASIC. However, as mentioned previously, programmable logic generally requires specialized CAD tools, and thus can create tool interface problems when used in a standard cell ASIC. For example, the use of a gate array place and route tool for a standard cell ASIC will generally require conversion of standard cell tool infrastructure over to the gate array tool and corresponding re-training of standard cell tool users, thereby imposing a high development cost burden on what are typically only a few candidate applications. In addition, the use of programmable logic can create difficult "floor plan" issues. Other drawbacks include the fact that programmable gate array density is typically only half to less than half the density of standard cell, which affects die size and thus piece part cost, and can also impact performance.

Another significant problem associated with the standard cell integrated circuit design approach and other similar techniques is that the use of such techniques can lead to undesirable "antenna errors" in the resulting design. These antenna errors are typically created as a result of place and route operations in the integrated circuit design process. An antenna node refers generally to an electrical node of the integrated circuit, and typically comprises all conducting structures coupled thereto and physically existing at a given processing level of the integrated circuit. An antenna error can result, by way of example and not limitation, when a given antenna node exhibits an excessively large ratio of exposed metal to active gate area. More specifically, the active gate area may be defined in a given application as the total area common to certain active gate materials, such as the total area common to a first polysilicon (Poly 1) layer and a thin gate oxide (TOX). When the ratio of the exposed metal to the active gate area becomes too large, electrostatic charges created on the metal during processing can become large enough to break down the attached gate oxide, thereby destroying the circuit.

In accordance with conventional practice, antenna errors are typically repaired using one of two different approaches. The first approach is to connect each of the antenna nodes that is associated with an antenna error condition to a standard cell diode, where the standard cell diode is added to the design after completion of a place and route process. For example, an N+/Ptub standard cell diode may be connected to the antenna node. However, standard cell diodes added subsequent to the place and route process generally cannot be moved or removed once the ordering of base levels is established. In other words, these standard cell diodes are fixed and cannot be modified as needed unless all mask levels are changed, which is an unduly expensive and time-consuming process. A possible variant of this first approach is to add a diode to every standard cell input, but this is very area inefficient.

The second approach mentioned above is to repair a given antenna error by breaking the metal as close as possible to the gate and re-routing or "jogging" the metal to an upper metal layer. However, automated techniques for implementing this approach generally do not fix all of the antenna errors and in a given application can leave hundreds of unresolved errors.

It is therefore apparent that a need exists for improved techniques for correcting antenna errors in an integrated circuit design, preferably in a manner that is programmable but also fully compatible with standard cell CAD tools.

SUMMARY

The present invention solves one or more of the above-noted problems by providing spare gates distributed throughout an integrated circuit design prior to or in conjunction with a place and route process, and then utilizing the spare gates within the place and route process to correct antenna errors. The invention in an illustrative embodiment utilizes spare gates that are constructed by replication of a base transistor structure of a programmable cell technology that is fully compatible with standard cell CAD tools.

In accordance with one aspect of the invention, an integrated circuit includes standard cells interspersed with spare gates. For example, the circuit may include one or more rows of spare gates arranged between groups of rows of standard cells, or islands of spare gates arranged between groups of rows of standard cells. The spare gates may comprise metal programmable spare gates, standard cell type spare gates or other types of spare gates, and are embedded in the integrated circuit design so as to be utilizable to repair faults in subsequent design iterations. A signal line of the integrated circuit having a detected antenna error associated therewith is coupled via one or more conductors associated with at least one metal layer of the integrated circuit to a diode or other antenna error control circuitry formed using at least one of the spare gates. The conductors may be implemented, by way of example, in one or more upper metal layers of the integrated circuit which collectively overlie at least one base layer of the integrated circuit.

In accordance with another aspect of the invention, the standard cells and spare gates are preferably placed in accordance with a placement operation of an automated place and route process of a standard cell CAD tool. The coupling of the signal line having the detected antenna error associated therewith to the diode or other antenna error control circuitry formed using at least one of the spare gates is preferably determined as part of a routing operation of the automated place and route process of the standard cell CAD tool. The spare gates are preferably implemented using a base transistor structure compatible with the standard cell CAD tool.

The antenna error correction techniques of the present invention provide a number of significant advantages over the conventional techniques previously described. For example, conductors associated with one or more upper metal mask layers can be used to perform the antenna correction, such that base layer mask set costs, lot start costs and fabrication time are not adversely impacted by the antenna error correction. In addition, the conductors and other circuit elements used to implement antenna error corrections can be further processed using an otherwise conventional standard cell CAD flow, thereby obtaining the benefit of post-layout operations such as parasitic extraction, simulation and verification. Furthermore, the implementation of the antenna error correction in a place and route process also ensures that the antenna corrections will not have to be recreated each time there is a design change.

DETAILED DESCRIPTION

The present invention will be described in conjunction with illustrative techniques for correcting antenna errors using spare gates during a routing operation of an automated place and route process. The place and route process is preferably part of a standard cell computer-aided design (CAD) tool. In the illustrative embodiments, the spare gates are implemented using a base transistor structure that is fully programmable. The term "programmable" in this context is intended to include without limitation arrangements in which circuit functionality is alterable by changes in metallization layers only. For example, the spare gates implemented using the base transistor structure in the illustrative embodiments of the invention described herein may be elevated to a designated metal layer, e.g., a Metal 2 (M2) layer, using elevation studs, vias or other similar mechanisms, such that any configuration of spare gates into active gates can be implemented in the M2 layer. Similar techniques may be used to elevate the interconnections for the base transistor structures to other metal layers. The spare gates are typically convertible to active gates through changes in only a subset of the metallization layers of the integrated circuit, which provides considerable simplification and cost savings in the design process. It should be noted that the term "spare gate" as used herein is intended to include without limitation spare gate cells as well as other types of circuitry suitable for interconnection with standard cell circuitry in a given integrated circuit design, such as programmable gates or other types of circuits specifically set aside for altering circuit design functionality subsequent to an initial design.

Figure 1A:
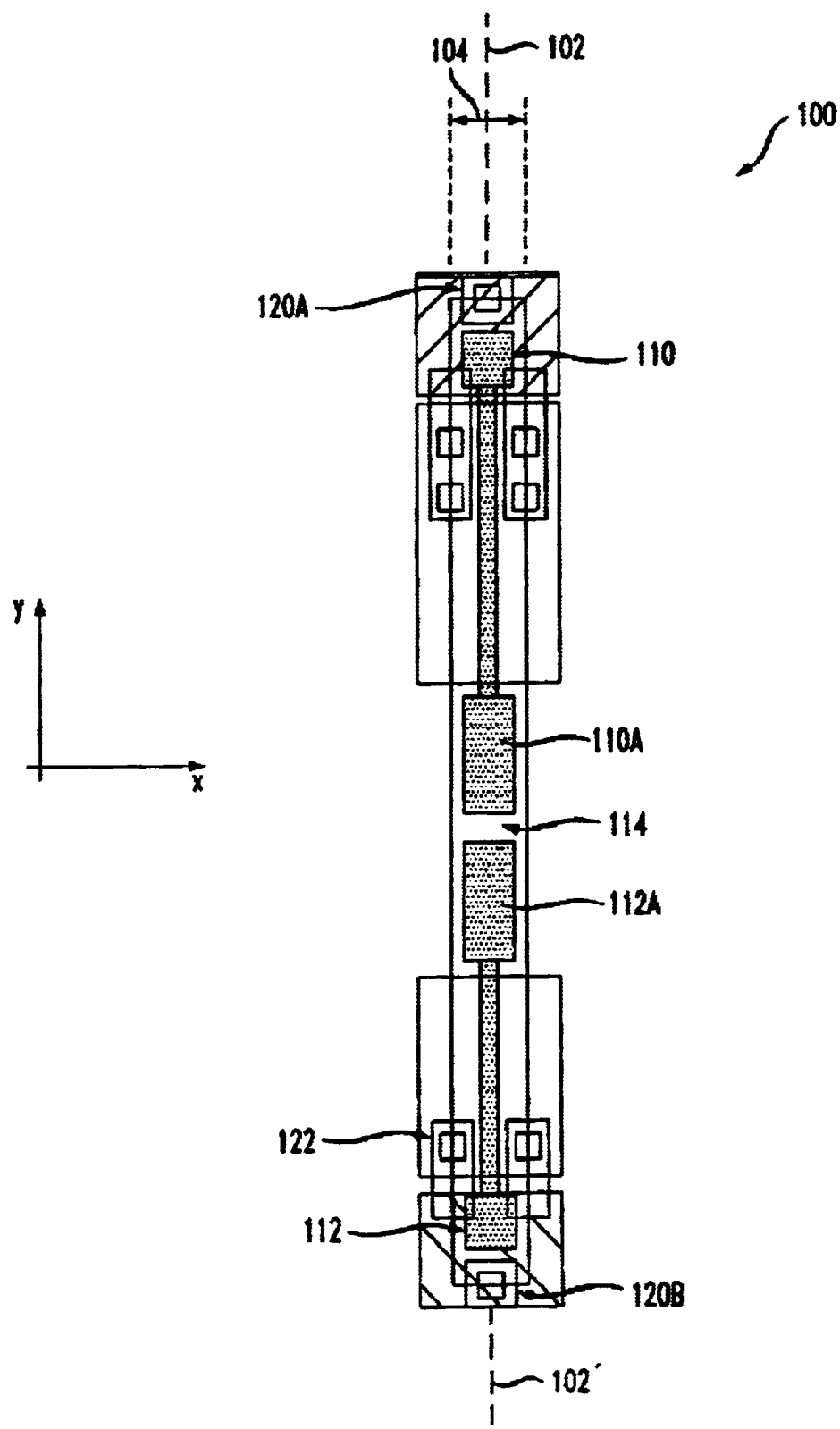
FIG. 1A shows an example base transistor structure suitable for use in forming spare gates for use in conjunction with the present invention.

FIG. 1A shows a base transistor structure 100 of the type described in the above-cited U.S. patent application Ser. No. 10/082,050, filed Feb. 14, 2002 in the name of inventors Stephen R. Cebenko et al. and entitled "Integrated Circuit Base Transistor Structure and Associated Programmable Cell Library." The base transistor structure 100 may be used as a building block to create spare gates suitable for use in correcting antenna errors in accordance with the techniques of the invention. The base transistor structure 100 in this embodiment is symmetric about vertical dashed line 102–102' corresponding to a y-axis and has a width that corresponds approximately to an x-grid width 104 of a conventional standard cell CAD tool, e.g., a standard cell place and route tool. This single grid symmetry advantageously allows cells created from the base structure to fully emulate standard cell behavior within a standard cell CAD tool environment. The single grid symmetry is also very area efficient.

It should be noted that the x-grid width and other dimensions of the base transistor structure as utilized for standard cells may differ from that utilized for spare gate cells. For example, the x-grid width and height of a given spare gate cell may be slightly larger than the corresponding width and height, respectively, of a standard cell. Standard cell CAD tools generally support such mixed-grid applications but typically only function well when one particular grid width is dominant. For the illustrative embodiments described herein, in which the integrated circuit is primarily formed of standard cells with interspersed spare gate cells present in substantially lower numbers relative to the standard cells, the standard cell grid width is typically dominant.

An integrated circuit comprising multiple base transistor structures arranged in rows may be assumed for illustrative purposes to be configured such that each row runs along the x-axis and one moves from one row to an adjacent row by moving along the y-axis.

The base transistor structure 100 includes a pair of split gates 110 and 112 having respective extended regions 110A and 112A separated as indicated at 114. Gate isolation can be provided using this split gate arrangement, as is described in greater detail in the above-cited U.S. patent application Ser. No. 10/082,050.

The gates extend below a power bus in order to allow transistors to be disabled and to create source and drain isolation regions. The gate extensions permit so-called "crossover" routing within cells so as to allow a more compact cell width. As is apparent from FIG. 1A, the base transistor structure 100 is uniform and symmetric. This base structure ensures that all cell-level connections between a given set of the structures can be created by means of metal layer changes only.

In an example standard cell CAD tool environment, the cells are row based, and a given cell can move along a row in single grid increments. The cells can be flipped and rotated about the y-axis, and can be any number of grids in length. The cell outlines and pin terminals are all typically placed on a grid of the standard cell CAD tool. The base transistor structure 100 of FIG. 1A is particularly well suited for use in this type of standard cell CAD tool environment, but can also be used in other environments. More particularly, the base transistor structure 100 is preferably implemented using the above-noted single grid symmetry, so as to provide full compatibility with standard cell CAD tools.

It should be noted that spare gate cells may be either on-grid or off-grid entities due to their typical minority usage in a given implementation relative to standard cells.

The base transistor structure 100 includes a number of well ties implemented as indicated generally at 120A and 120B. These well ties are preferably shared between rows of a given cell. More particularly, in an embodiment which includes multiple rows of cells each formed from one or more of the base transistor structures 100, the upper well tie 120A associated with a particular base transistor structure in a given row also serves as the lower well tie in a corresponding base transistor structure in the row immediately above the given row, while the lower well tie 120B associated with the particular base transistor structure in the given row also serves as the upper well tie in the row immediately below the given row. The well ties may also be separated between rows. The metallization as shown generally at 122 is included in the figure for reference purposes only, and may be considered at least in part as separate from the base transistor structure 100.

The well ties may be shared, in the manner described above, between different spare gates as well as between spare gates and standard cells.

The base transistor structure 100 of FIG. 1A may be viewed, by way of example and without limitation, as providing a pair of field effect transistors (FETs), i.e., a P-type FET (PFET) and an N-type FET (NFET), suitable for use in otherwise conventional complementary metal-oxide-semiconductor (CMOS) logic circuitry. The gates 110 and 112 of the base transistor structure may therefore correspond to gates of the respective PFET and NFET devices, with similar correspondence between source and drain elements of the base transistor structure and source and drain elements of the respective PFET and NFET devices. When arranged in rows, the base transistor structures may be configured such that the PFET devices in one row are adjacent PFET devices in an adjacent row, while the NFET devices in one row are adjacent NFET devices in another row. For example, if the upper device associated with a particular base transistor structure in a given row is a PFET device and the lower device associated with the particular base transistor structure in the given row is an NFET device, the lower device in a corresponding base transistor structure in the row immediately above the given row is preferably a PFET device, while the upper device in a corresponding base transistor structure in the row immediately below the given row is an NFET device, and so on for the other base transistor structures. Such an arrangement facilitates the previously-described sharing of well ties.

The particular base transistor structure shown in FIG. 1A is by way of illustration only. Those skilled in the art will recognize that the structure in alternative embodiments may be symmetric about both x and y axes, may have a width other than a single x-grid width, may include gate structures and other transistor structures which differ from those specifically shown, and may be otherwise reconfigured to meet the needs of a particular application.

It should be noted that the transistor devices of the base transistor structure 100 may be constructed using conventional techniques of a type well-known in the art. The base transistor structure in cross-section will therefore be of a type consistent with these well-known conventional techniques, and is therefore not explicitly shown or described herein.

The single grid symmetry in the illustrative transistor base structure of FIG. 1A ensures that a library of circuit cells created from the base transistor structure can fully emulate standard cell behavior within a standard cell CAD tool environment. In the illustrative embodiment, cells are created from a particular arrangement of multiple base transistor structures, and as a result any cell can be replaced by another cell in a standard cell placement operation implemented by a standard cell CAD tool. In addition, the cells can be flipped, rotated, and mirrored on one or more axes by changing only upper programmable metal layers of the circuit design. This type of standard cell compatibility is an important advantage of the base transistor structure of FIG. 1, since a typical integrated circuit design facility generally has a large financial investment in, and is therefore highly dependent on, a given CAD environment.

As is described in the above-cited U.S. patent application Ser. No. 10/082,050, the base transistor structure illustrated in FIG. 1A can be used to implement a wide variety of different types of gates, such as NAND gates, flip-flops, etc. The present invention in the illustrative embodiments thereof to be described below in conjunction with FIGS. 2 through 6 utilizes a base transistor structure such as that shown in FIG. 1A to form spare gates in the form of diodes. The diodes are then used in a routing operation of an automated place and route process to correct detected antenna errors. It is to be appreciated, however, that the present invention does not require the use of the particular base transistor structure of FIG. 1A, and spare gates formed using other suitable structures can be used. For example, spare gate diodes suitable for use with the present invention may be implemented using dedicated diodes, standard cell diodes, etc. Other types of antenna error control circuitry may also be used.

Figure 1B:
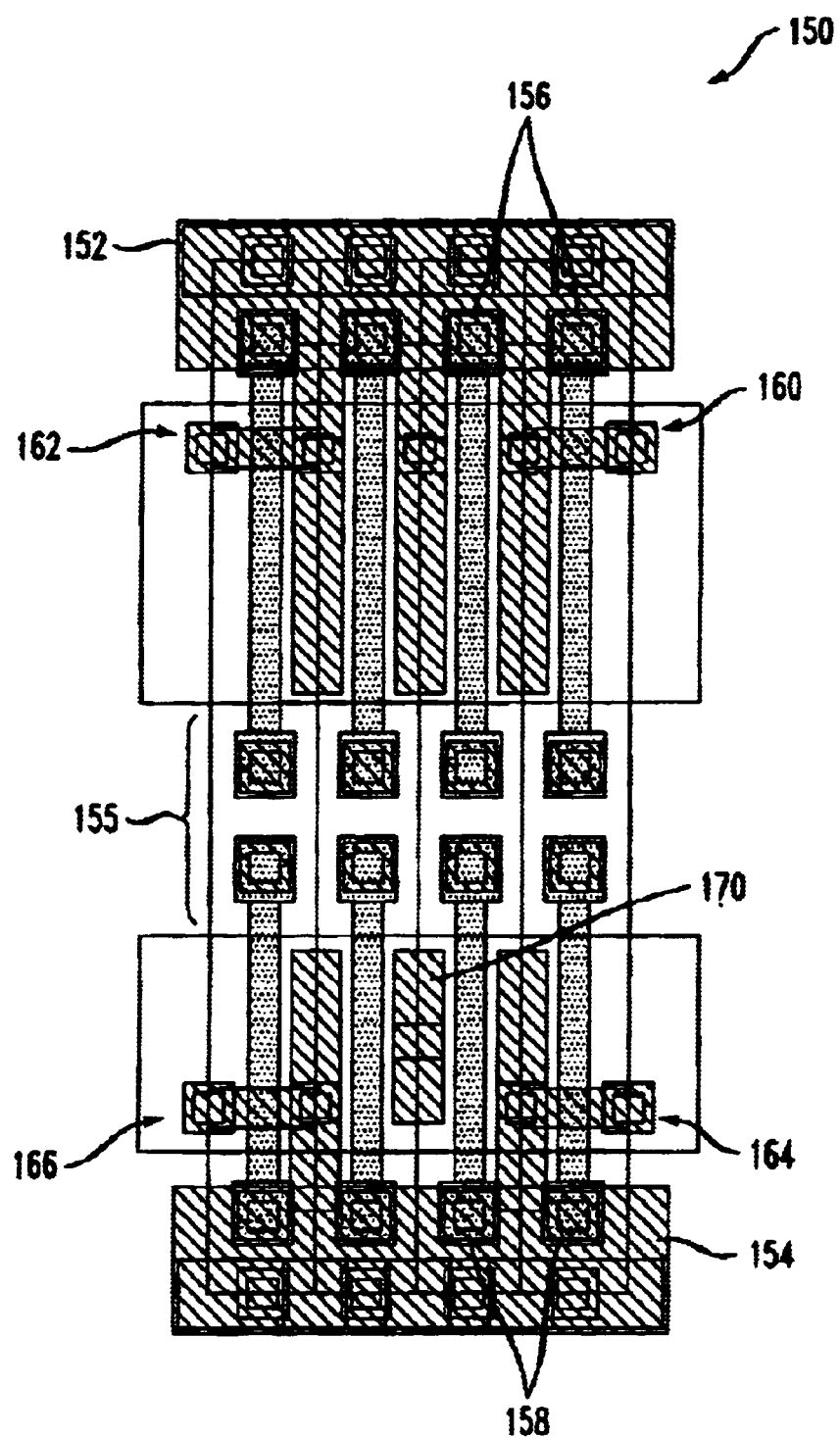
FIG. 1B shows an example spare gate diode cell in accordance with the invention, formed using a base transistor structure of the type shown in FIG. 1A.

FIG. 1B shows an example of a spare gate diode cell 150 formed using four adjacent base transistor structures of a type similar to that shown and described in conjunction with FIG. 1A. The spare gate diode cell 150 is a four-grid diode cell, and includes an upper supply voltage (VDD) power bus portion 152 and a lower supply voltage (VSS) power bus portion 154. The base transistor structures utilized in the diode cell 150 have a different configuration in the split gate region 155 than the FIG. 1A structures, but are otherwise assumed to be configured substantially as shown and described in conjunction with FIG. 1A.

In the diode cell 150, the connections shown generally at 156 are associated with the upper gates of the four base transistor structures. These connections are configured such that the corresponding PFETs are turned off or disabled and thus placed in a high impedance or tri-state output condition. Similarly, the connections shown generally at 158 are associated with the lower gates of the four base transistor structures, are the corresponding NFETs are turned off or disabled and thus placed in a high impedance or tri-state output condition. The connections shown generally at 160, 162, 164 and 166 are configured to connect the transistor source/drain regions to their respective supply voltages, for compatibility with verification tools, and may be omitted in other embodiments.

The node 170 in the diode cell 150 denotes a diode terminal suitable for use as a conventional floating source/drain connection.

The diode cell 150 thus utilizes a transistor in a turned off or tri-stated output condition to form a diode. The diode thus formed constitutes a parasitic diode capable of operating in a reverse-bias mode so as to provide a leakage path to the integrated circuit substrate. The term "diode" as used herein should be construed generally to include without limitation not only this type of parasitic diode, but also other types of diodes that may be formed from transistors, and discrete or dedicated diodes not formed from transistors. The FIG. 1B diode cell should therefore be viewed as just one example of a type of diode suitable for use in correcting antenna errors in accordance with the techniques of the invention. Those skilled in the art will recognize that many other diode configurations may be used. In addition, as indicated previously, other types of single-element or multiple-element antenna error control circuitry may be used in place of the diode in other embodiments of the invention. The diode is thus an example of one type of antenna error control circuitry in accordance with the invention.

Figure 2:
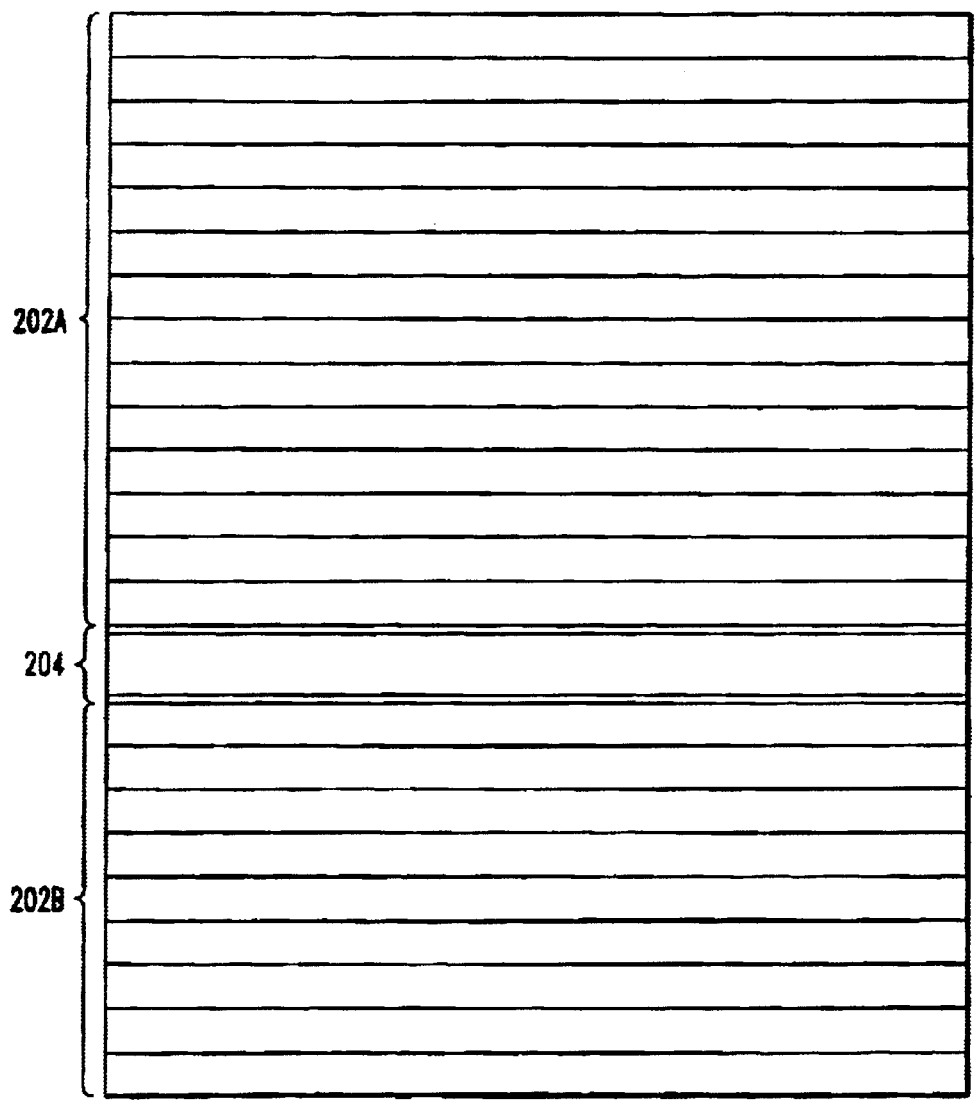
FIG. 2 shows a simplified representation of an integrated circuit having rows of standard cells and a single row of spare gate cells.

FIG. 2 shows a simplified diagram of a standard cell design layout for a portion of an integrated circuit 200. The diagram may correspond to a representation of the integrated circuit as generated by a standard cell CAD tool prior to application of a routing operation of an automated place and route process. The design layout for the integrated circuit 200 as shown includes a number of standard cell rows arranged in groups 202A and 202B, each including multiple standard cell rows, with a single row 204 of spare gates arranged between the groups 202A and 202B of standard cell rows.

Each standard cell corresponds generally to a particular predefined type of logic gate or other circuit element that is placeable by a placement operation of the place and route process.

It should be understood that the FIG. 2 diagram may represent a portion of an integrated circuit design having a substantially larger number of standard cell rows and interspersed spare gate rows than the number specifically shown. The diagram is thus simplified for clarity of illustration. In addition, the use of rows of spare gates is by way of example only. The invention can be implemented using other arrangements of spare gates, such as one or more "islands" of spare gates interspersed with standard cells as described in co-pending U.S. patent application Attorney Docket No. Bingert 1-2-2-2-5-3, filed concurrently herewith and hereby incorporated by reference herein. In such an arrangement, a given one of the islands may be formed as an m×n array of spare gate cells, where both m and n are greater than one.

The spare gates in the illustrative embodiments may comprise metal-programmable spare gates, standard cell type spare gates or other types of spare gates, and are embedded in the integrated circuit design so as to be utilizable to repair faults in subsequent design iterations.

As noted previously, the spare gates, as a result of their minority usage relative to standard cells in a typical implementation, may differ in x-grid width and height relative to the standard cells with which they are interspersed.

It should be noted that antenna errors correctable using the techniques of the invention may be created through the use of spare gates as active gates in altering circuit functionality. Thus, the antenna error correction techniques of the invention are well-suited for use with integrated circuit design processes that utilize spare gates for altering circuit functionality.

Figure 3:
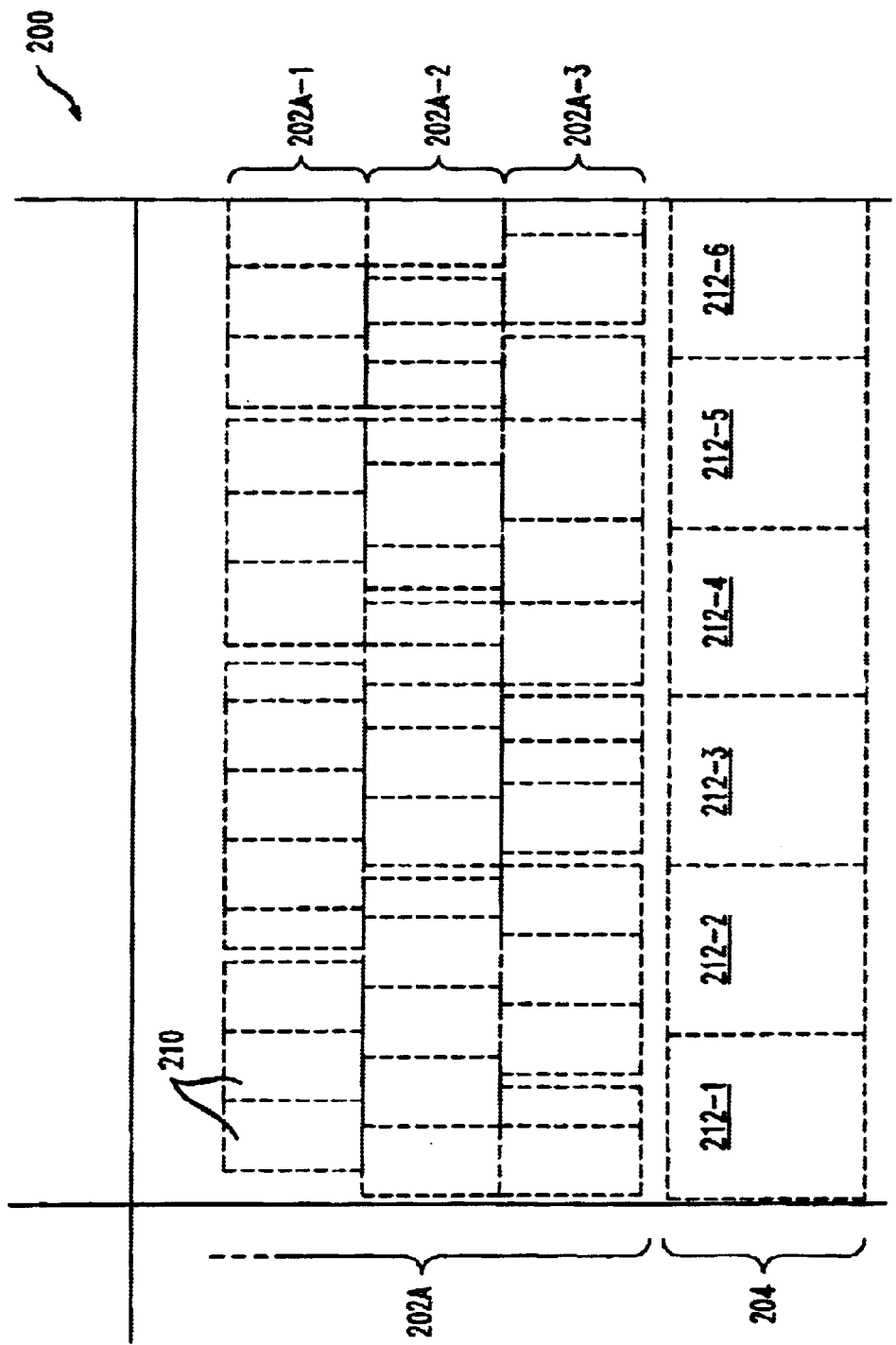
FIG. 3 is a more detailed view of a number of the standard cell rows and the spare gate cell row of the FIG. 2 integrated circuit, after completion of a placement operation of a place and route process.

FIG. 3 shows a more detailed view of a portion of the design layout for the integrated circuit 200. The design layout is shown subsequent to a placement operation of the automated place and route process. A number of the standard cell rows of the group 202A are shown, including standard cell rows 202A-1, 202A-2 and 202A-3. It can be seen that each of the standard cell rows includes a number of different standard cells 210, shown in dashed outline. The standard cells have been placed in accordance with the placement operation. The particular arrangement of individual cells in a given row is by way of example only. The spare gate row 204 as shown in FIG. 3 includes a number of spare gates, including spare gates 212-1, 212-2, 212-3, 212-4, 212-5 and 212-6. Again, the particular number and arrangement of spare gates 212 is by way of example only, and other embodiments may use other arrangements. In this embodiment, each of the spare gates 212 is assumed to comprise one or more diodes implemented using a base transistor structure similar to that of FIG. 1A.

Figure 4:
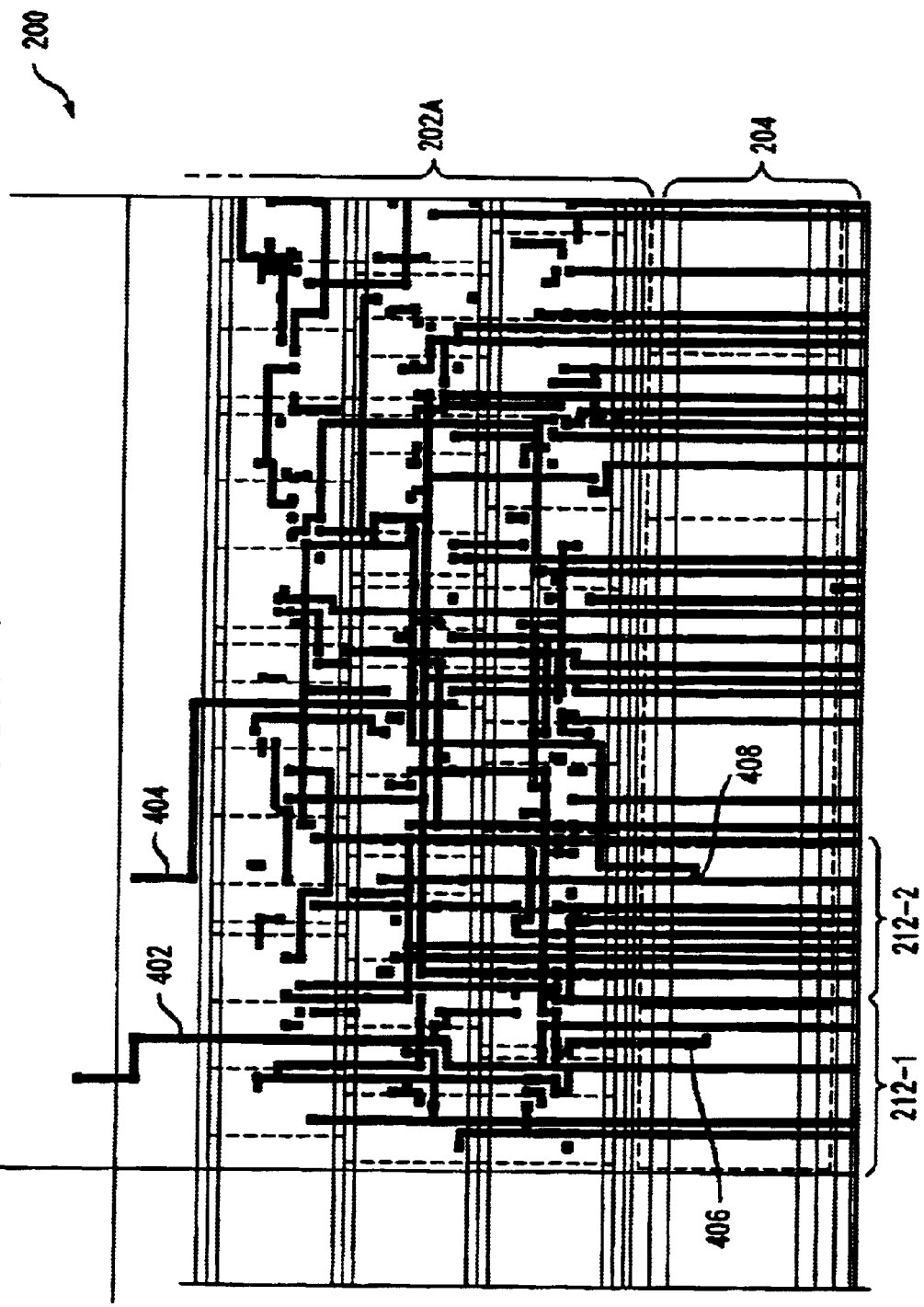
FIG. 4 shows the FIG. 3 integrated circuit after completion of a routing operation of a place and route process.

FIG. 4 shows the FIG. 3 portion of the design layout for the integrated circuit 200 after completion of at least part of a routing operation of the automated place and route process. As part of the routing operation, a large number of connections have been made in metal layers of the integrated circuit between circuit nodes of the standard cells, in order to implement a desired functionality in the integrated circuit

200. These connections are made in a conventional manner and therefore are not described in detail herein. In addition, antenna errors have been detected on two of the circuit nodes, corresponding generally to signal lines coupled to conductors 402 and 404. The violating signal lines are not explicitly shown in FIG. 4, but are instead shown in FIG. 5. The antenna errors associated with these signal lines may be detected using conventional techniques, such as determining when a given antenna node exhibits an excessively large ratio of exposed metal to active gate area. As indicated previously, the active gate area may be defined in a given application as the total area common to certain active gate materials, such as the total area common to a first polysilicon (Poly 1) layer and a thin gate oxide (TOX). Other antenna error detection techniques can also be used. The invention does not require the use of any particular technique for antenna error definition or detection.

In accordance with the techniques of the invention, each of these antenna nodes is coupled via one or more conductors of the metal layers to a corresponding one of the spare gates 212-1 and 212-2. More specifically, the antenna node corresponding to conductor 402 is coupled as indicated at 406 to a diode associated with spare gate 212-1, and the antenna node corresponding to conductor 404 is coupled as indicated at 408 to a diode associated with spare gate 212-2. The remaining spare gates in the row 204 remain unused at this point in the routing process.

A number of different metal layers are used to form the conductors shown in FIG. 4. In general, conductors routed along the vertical axis in the figure are formed in Metal 2 or Metal 4 layers, while conductors routed along the horizontal axis in the figure are formed in Metal 1, Metal 3 or Metal 5 layers. The conductors 402 and 404 are formed in this embodiment in the Metal 2 layer. The final connections 406, 408 to the spare gate diodes are implemented in this embodiment in a Metal 1 layer. These particular metal arrangements should be viewed as illustrative examples only. Other types and configurations of metal layers can also be used to form particular conductors or other connections, as will be appreciated by those skilled in the art.

A significant advantage of this approach is that the unused spare gates do not require any netlist content. Only those spare gates that are actually converted to diodes used for antenna error correction become part of the netlist, which reduces the size of the netlist and simplifies netlist processing operations.

In general, the routing operation may be configured such that the spare gate selected for use in correcting a given antenna error is the one most proximate to the violating signal line. Conventional routing techniques may be used to determine the particular minimal-length conductor routing that will correct a given antenna error. Proximity of repair is generally controlled by the placement of the spare gates within the standard cells. It is preferably predetermined by a suitable geometric arrangement. For example, the island spare gate placements described in the above-cited co-pending U.S. patent application Attorney Docket No. Bingert 1-2-2-2-5-3 can considerably facilitate the provision of an antenna error repair in close proximity to the need.

Figure 5:
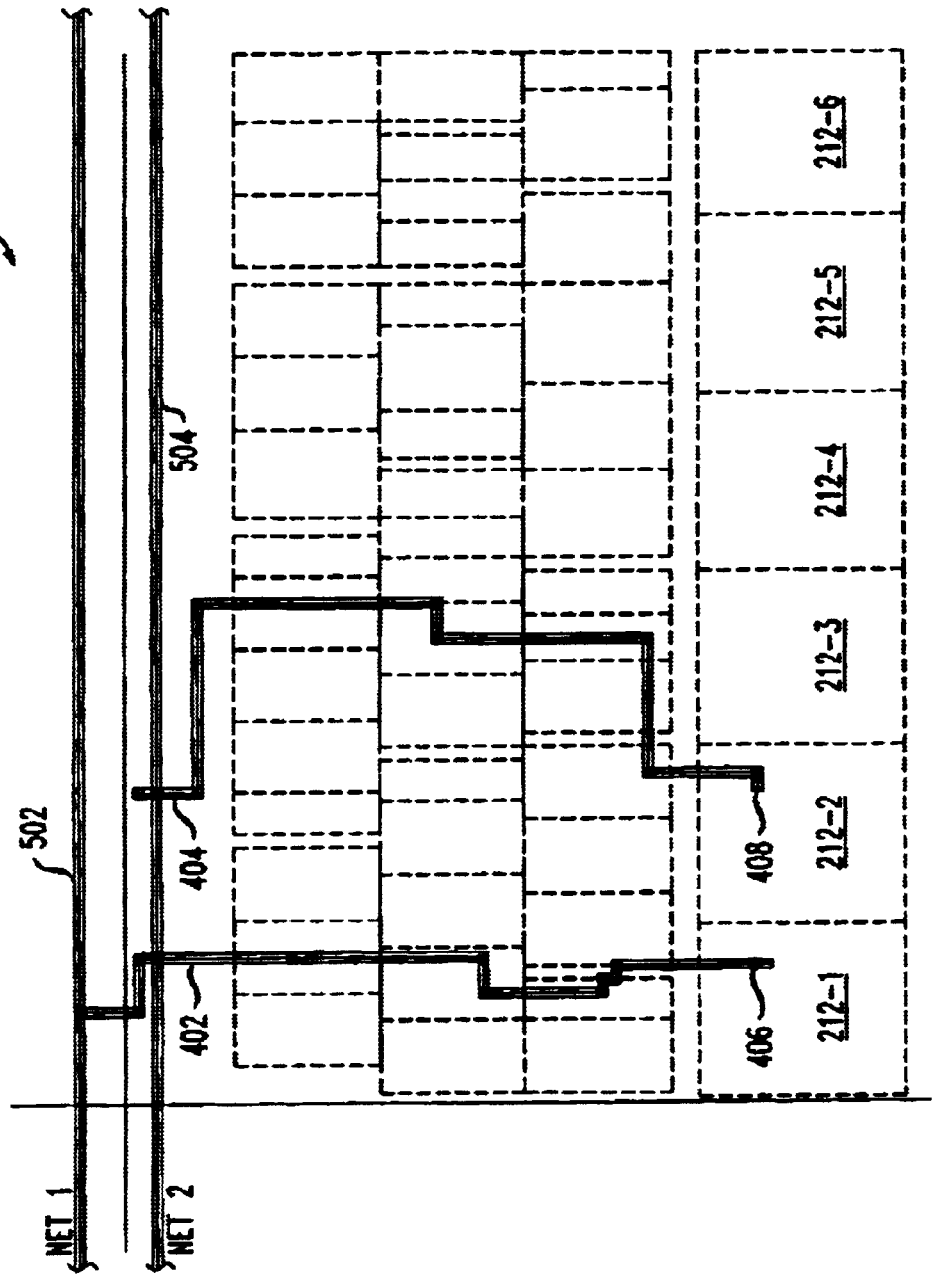
FIG. 5 illustrates the manner in which antenna errors are corrected in the FIG. 4 integrated circuit during the routing operation using the spare gate cells, in accordance with an illustrative embodiment of the invention.

FIG. 5 shows another view of the integrated circuit 200. In this view, the only conductors shown are the violating signal lines and the corresponding corrective metal conductors associated with the antenna errors. It can be seen that the conductors 402 and 404 couple the respective signal lines 502 and 504 to the respective spare gate diodes 212-1 and 212-2, thereby correcting the antenna errors. The signal lines 502 and 504 associated with the corrected antenna errors are also denoted as Net 1 and Net 2, respectively. The metal conductors 402, 404 thus connect the violating signal lines Net 1 and Net 2 to diodes formed using the spare gates 212-1 and 212-2, which corrects the detected antenna errors.

It should be appreciated that the integrated circuit drawings as shown in FIGS. 2 through 5 may be viewed as simplified drawings of at least a portion of an actual integrated circuit, or may be viewed as graphical representations of an integrated circuit design as generated on a monitor or other display associated with a computer or other standard cell CAD workstation.

Figure 6:
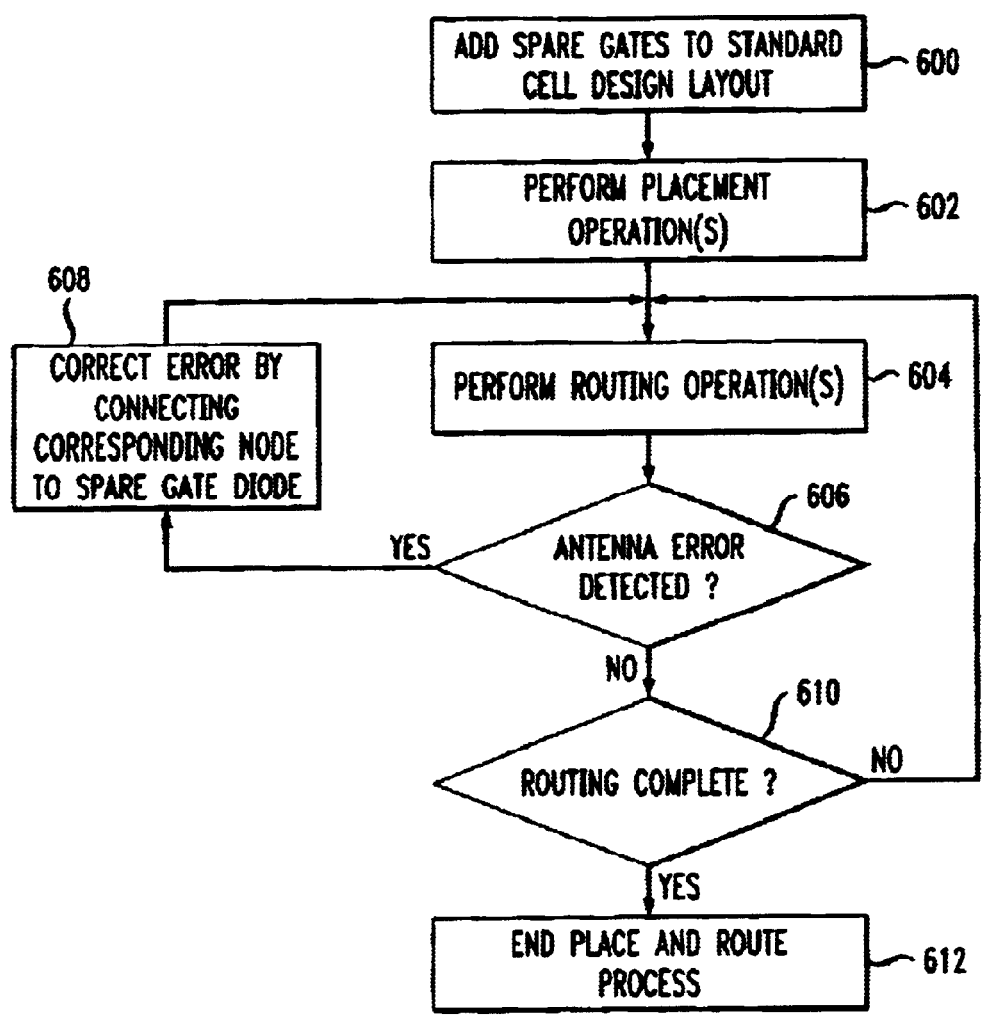
FIG. 6 is a flow diagram of an automated process for correcting antenna errors in accordance with the present invention.

FIG. 6 is a flow diagram of an automated process for correcting antenna errors in accordance with the present invention. In step 600, spare gates are added to a standard cell design layout. An example of this step was described in conjunction with FIGS. 2 and 3, and involved adding a row of spare gates 204 between groups of multiple standard cell rows 202A and 202B, prior to or in conjunction with a standard cell placement operation.

In step 602, one or more additional placement operations are performed, which may involve placement of particular types of standard cells at particular positions in a given row of such cells, as was illustrated in conjunction with FIG. 3. Routing operations are then performed in steps 604, 606, 608 and 610 in a manner which detects and corrects the antenna errors as part of a set of one or more automated routing operations. More particular, a routing operation is performed in step 604, and as part of that operation checks are periodically performed on signal lines generated as a result of the routing in order to determine if one or more of the signal lines includes an antenna error. For example, the routing operation may be configured to automatically test each routing path that is generated for compliance with established criteria. If an antenna error is detected in step 606, the routing operation in step 608 corrects the error by connecting the corresponding circuit node to a diode formed using a corresponding one of the spare gates that was previously added to the standard cell design layout in step 600. The process then returns to step 604 to continue the routing operation, while still detecting and correcting antenna errors in steps 606 and 608 as needed. Step 610 determines if the routing operation is complete. If the routing operation is not complete, the process returns to step 604. Otherwise, the automated place and route process is terminated as indicated in step 612.

The antenna error correction techniques of the present invention provide a number of other significant advantages over conventional techniques. For example, by implementing the antenna detection and correction in a routing operation of a place and route process, using diodes formed from spare gates inserted into a standard cell design, the correction can be implemented using only conductors formed in a subset of the metal layers, saving most of the mask set costs. More particularly, conductors associated with one or more upper metal mask layers can be used to perform the antenna correction, such that base layer mask set costs, lot start costs and fabrication time are not impacted in any way by the antenna error correction. In addition, the resulting antenna error corrections can be further processed using an otherwise conventional standard cell CAD flow, involving post-layout operations such as parasitic extraction, simulation and verification. The information gathered by applying such post-layout operations to a design which already includes antenna corrections is important and cannot be easily obtained in conventional practice which, for example, corrects the antenna errors only after completion of the place and route process. Furthermore, the implementation of the antenna error correction in a place and route process also ensures that the antenna corrections will not have to be recreated each time there is a design change. In contrast, conventional external antenna error correction techniques may require changes to substantially all circuit mask layers, thereby considerably slowing the development time.

As indicated previously, the present invention can be implemented in the form of an integrated circuit comprising a number of standard cells and one or more spare gate cells used for correcting antenna errors. A given integrated circuit constructed using the techniques of the invention can include spare gate cells constructed from the above-described base transistor structure or other suitable structures, in combination with other types of conventional standard cells. In these and other possible implementations of the invention, the base transistor structure cells may be used to supplement the use of standard cells, or to otherwise operate in conjunction with such standard cells, in order to produce advantages in the overall design and design process.

It should also be noted that the present invention can also be implemented at least in part in the form of software that is executed on a computer, workstation or other processing device having one or more processor elements and one or more memory elements. For example, a suitable representation of an integrated circuit design in accordance with the invention may be implemented in CAD tool software to be used on a computer or other workstation. The invention can thus be implemented on a computer or workstation in an otherwise conventional standard cell CAD environment.

The above-described embodiments of the invention are intended to be illustrative only. For example, although the invention has been illustrated in conjunction with particular base transistor structures, alternative structures may be used to form spare gates in accordance with the invention. In addition, the particular techniques used to define and detect antenna errors may be altered in accordance with the invention. Furthermore, the particular manner in which the spare gates are interspersed with standard cells may be varied. More specifically, islands or other clusters of spare gates may be used instead of rows of spare gates as in the illustrative embodiment. Also, different diode configurations or other antenna error control circuitry configurations may be used. These and other alternative embodiments within the scope of the appended claims will be apparent to those skilled in the art.

What is claimed is:

1. An integrated circuit comprising:
   a plurality of standard cells; and
   a plurality of spare gates interspersed with the standard cells;
   wherein a signal line of the integrated circuit having a detected antenna error associated therewith is coupled via one or more conductors associated with at least one metal layer of the integrated circuit to antenna error control circuitry formed using at least one of the spare gates.

2. The integrated circuit of claim 1 wherein the antenna error control circuitry comprises a diode.

3. The integrated circuit of claim 1 wherein the one or more metal layers comprise upper metal layers of the integrated circuit which collectively overlie at least one base layer of the integrated circuit.

4. The integrated circuit of claim 1 wherein at least a portion of the standard cells and spare gates are placed in accordance with a placement operation of an automated place and route process of a standard cell design tool.

5. The integrated circuit of claim 1 wherein the coupling of the signal line having the detected antenna error associated therewith to the antenna error control circuitry formed using at least one of the spare gates is determined as part of a routing operation of an automated place and route process of a standard cell design tool.

6. The integrated circuit of claim 1 wherein the plurality of spare gates comprises at least one row of multiple spare gate cells arranged between rows of first and second groups of the standard cells.

7. The integrated circuit of claim 1 wherein each of at least a subset of the spare gates is configurable for implementation of at least antenna error control circuitry element suitable for connection to a signal line of the integrated circuit via one or more metal layers of the integrated circuit.

8. The integrated circuit of claim 1 wherein each of at least a subset of the spare gates is implemented using one or more base transistor structures.

9. The integrated circuit of claim 8 wherein the base transistor structure has a width corresponding approximately to a single grid of a standard cell design tool.

10. The integrated circuit of claim 8 wherein metallization layer connections of the integrated circuit are used to form the antenna error control circuitry from one or more of the base transistor structures.

11. The integrated circuit of claim 1 wherein a given one of standard cells comprises a logic gate of the integrated circuit.

12. The integrated circuit of claim 1 wherein a given one of the spare gates is convertible to a diode using connections formed in a metallization layer of the integrated circuit.

13. The integrated circuit of claim 8 wherein the spare gates of the integrated circuit are each formed using one or more of the base transistor structures and the standard cells are not formed using the base transistor structures.

14. The integrated circuit of claim 8 wherein a given one of the base transistor structures comprises:
    a plurality of source regions;
    a plurality of drain regions, each adjacent to a corresponding one of the source regions; and
    at least first and second elongated gates, the first and second gates each overlying a corresponding subset of the source and drain regions, the first and second gates each extending longitudinally along a first axis from a first end adjacent one of the source and drain regions to a second end extending past another of the source and drain regions, the first and second gates being separated from one another at the second ends thereof;
    the base transistor structure being substantially symmetric about the first axis.

15. A method of designing an integrated circuit having a plurality of standard cells and a plurality of spare gates interspersed with the standard cells, the method comprising the steps of:
    detecting an antenna error associated with a signal line of the integrated circuit; and
    coupling the signal line of the integrated circuit having the detected antenna error associated therewith, via one or more conductors associated with at least one metal layer of the integrated circuit, to antenna error control circuitry formed using at least one of the spare gates.

16. An article of manufacture comprising one or more software programs for use in designing an integrated circuit having a plurality of standard cells and a plurality of spare gates interspersed with the standard cells, wherein the one or more software programs when executed implement the steps of:
    detecting an antenna error associated with a signal line of the integrated circuit; and
    coupling the signal line of the integrated circuit having the detected antenna error associated therewith, via one or more conductors associated with at least one metal layer of the integrated circuit, to antenna error control circuitry formed using at least one of the spare gates.

* * * * *